US005990598A

United States Patent [19]

Sudol et al.

[11] Patent Number: 5,990,598

[45] Date of Patent: Nov. 23, 1999

[54] SEGMENT CONNECTIONS FOR MULTIPLE ELEVATION TRANSDUCERS

[75] Inventors: Wojtek Sudol, Burlington; Francis E. Gurrie, North Andover, both of Mass.

[73] Assignee: Hewlett-Packard Company, Palo Alto, Calif.

[21] Appl. No.: 08/935,744

[22] Filed: Sep. 23, 1997

[51] Int. Cl.[6] .................... H01L 41/08

[52] U.S. Cl. .................... 310/334; 310/327

[58] Field of Search .................... 310/322, 334, 310/327, 333, 365, 366

[56] References Cited

U.S. PATENT DOCUMENTS

| | | | |
|---|---|---|---|
| 3,496,617 | 2/1970 | Cook et al. | 29/25.35 |
| 3,587,561 | 6/1971 | Ziedonis | 310/322 |
| 3,718,898 | 2/1973 | Cook et al. | 340/10 |
| 3,952,387 | 4/1976 | Iinuma et al. | 29/25.35 |
| 3,979,711 | 9/1976 | Maginness et al. | 340/1 R |
| 4,117,074 | 9/1978 | Tiersten et al. | 310/320 |
| 4,211,948 | 7/1980 | Smith et al. | 310/322 |
| 4,211,949 | 7/1980 | Brisken et al. | 310/322 |
| 4,217,684 | 8/1980 | Brisken et al. | 29/25.35 |
| 4,281,550 | 8/1981 | Erikson | 73/626 |
| 4,385,255 | 5/1983 | Yamaguchi et al. | 310/335 |
| 4,404,489 | 9/1983 | Larson, III et al. | 310/334 |
| 4,462,092 | 7/1984 | Kawabuchi et al. | 367/105 |
| 4,470,308 | 9/1984 | Hayakawa et al. | 73/642 |
| 4,479,069 | 10/1984 | Miller | 310/334 |
| 4,576,045 | 3/1986 | Miller-Jones | 73/626 |
| 4,686,408 | 8/1987 | Ishiyama | 310/334 |
| 4,734,963 | 4/1988 | Ishiyama | 310/327 |
| 5,744,898 | 4/1998 | Smith et al. | 310/334 |
| 5,855,049 | 1/1999 | Corbett et al. | 310/334 |
| 5,886,454 | 3/1999 | Ito et al. | 310/322 |

FOREIGN PATENT DOCUMENTS

| | | | |
|---|---|---|---|
| 1530783 | 11/1978 | United Kingdom | G01H 9/00 |

*Primary Examiner*—Thomas M. Dougherty

[57] ABSTRACT

A connection assembly for use in a multiple aperture ultrasonic transducer including an array of elements for transmitting and receiving wherein each element includes a plurality of segments and the connection assembly interconnects the segments of the elements and the segments to transmit/receive circuits to form the apertures of the array. The connection assembly includes an isolating layer superimposed on the segments with at least one via opening located within the area of each segment and a conductive layer superimposed on the isolating layer with conductive paths interconnecting the segments and the segments to the transmit/receive circuits to form the apertures of the array. The conductive layer forms a continuous layer covering the isolating layer, the interior surfaces of the via openings and the areas of the segments exposed through the via openings and is scribed to divide the conductive layer into the conductive paths. The conductive paths associated with each element are separated from the conductive paths associated with neighboring elements by the dicing cuts that divide the elements and segments from one another. A flex circuit is assembled coplanar with the segments and the isolating and conductive layers are superimposed on the elements and flex circuit so that the connections between the segments and flex leads are accomplished by the same processes.

5 Claims, 6 Drawing Sheets

SEGMENT CONNECTIONS FOR MULTIPLE ELEVATION TRANSDUCERS

FIELD OF THE INVENTION

The present invention relates to a design and the method of constructing ultrasonic transducers and, in particular, a design and method for interconnecting elements in multiple elevation transducers.

BACKGROUND OF THE INVENTION

Ultrasonic transducers are used in many medical applications and, in particular, for the non-invasive acquisition of images of organs and conditions within a patient, typical examples being the ultrasound imaging of fetuses and the heart. The ultrasonic transducers used in such applications are generally hand held, and must meet stringent dimensional constraints in order to acquire the desired images. For example, it is frequently necessary that the transducer be able to obtain high resolution images of significant portions of a patient's chest cavity through the gap between two ribs when used for cardiac diagnostic purposes, thereby severely limiting the physical dimensions of the transducer.

As a consequence, and because of the relatively small aperture between human ribs and similar constraints upon transducer positioning when attempting to gain images of other parts of the human body, there has been significant development of linear or phased array transducers comprising multiple transmitting and receiving elements, with the associated electronics and switching circuits, to provide relatively narrowly focused and "steerable" transmitting and receiving "beams". The most common of such transducers comprises a one element wide by multiple element long linear array of transmitting and receiving elements arranged in line along a flat plane or, preferably, along a concave or convex arc, thereby providing a greater scanning arc.

The transmitting and receiving beams of such transducers are formed and steered by selecting individual transducers elements or groups of transducer elements to transmit or receive ultrasonic energy, wherein each such individual transducer element or group of transducers elements forms an "aperture" of the transducer array. Such an array is thereby formed of a single row of apertures extending along the face of the array and such transducers are consequently referred to as "single aperture" transducers.

While such azimuth scanning single aperture arrays are advantageous for many applications, single aperture transducers have the disadvantage that they can scan only along the single plane of the transducer elements. As a consequence, there have been many attempts to construct transducers that are also capable of steering or focusing in elevation as well as azimuth, that is, along the axis at right angles to the azimuth plane along which the elements are arrayed as well as along the azimuth plane.

As is well understood, the formation and steering and/or focusing of the transmitting and receiving beams of a transducer are controlled by selection and use of the various separate physical divisions or areas of transducer material comprising the transducer array, which, as described above, are referred to as "apertures". In contrast to "single aperture" transducers, however, in which each aperture is formed by an element or group of elements extending across the face of the array as a single unitary area or division or the array, each corresponding element in a transducer capable of scanning in elevation is divided into multiple sub-elements, or segments. For this reason, and because each element position along such an array can form multiple apertures, that is, using different combinations of the sub-elements or segments of each of the transducer elements, such transducers are consequently referred to as "multiple aperture" transducers.

The shape, focus and direction of the transmitting and receiving beams of a multiple aperture transducer are again controlled by selection of the apertures of the array. In a multiple aperture array, however, each aperture is formed by one or more of the sub-elements, or segments, of the transducer elements, so that the apertures of a multiple aperture array can be used to steer and focus the transducer scan beam along the elevation axis as well as along the azimuth axis and can define multiple azimuthal scan planes, each being at a different angle of elevation.

It should be noted that in both single aperture transducers and in multiple aperture transducers the apertures may be either driven actively, or simply deactivated to reduce the size of the acoustic aperture, thereby controlling the shape, direction and focus of the transmitting and receiving beams formed by the transducer array.

The transducer elements of both single aperture and multiple aperture transducers are generally made of a piezoelectric material and the array of elements or sub-elements is generally mounted onto a body made of a backing material. Connections between the individual transducer elements and the associated electronics and switching elements are usually provided through various arrangements and combinations of thick and thin film circuits, flexible printed circuits and wires, which are generally located on the back of the array, between the array and the body, with leads running along the body to the transducer electronics. One or more layers of impedance matching material, generally considered to be a part of the elements themselves, is often superimposed upon the transducer elements to match the acoustic impedance of the transducer to the body or material being scanned, and a lens comprised of a suitable material may be additionally superimposed upon the impedance matching material to shape or focus the beams generated by the transducer elements. In some implementations, the impedance matching layers may have suitable acoustic characteristics and may be shaped to operate as an acoustic lens.

Single aperture transducers are generally constructed from a single piece of transducer material having a width equal to the length of one element and a length equal to the widths of the total number of elements plus spaces between the elements. One or more thin or thick film circuits or flexible printed circuits having connections and paths for the individual elements, or the like implemented in any of several other ways, are bonded to one side of the piece of transducer material and a layer or layers of matching material may be bonded to the radiating and receiving side of the transducer material to form a "stack" of the transducer material, circuits and matching layers. A temporary or permanent layer of backing material of some form, such as a flexible material, may also be bonded to the back of the stack to aid in handling the stack during manufacture.

Successive cuts are then made across the width of the transducer stack on the radiating/receiving side of the stack and at intervals corresponding to the widths of the elements and the spacing between the elements to divide the single piece of material into the individual elements. This operation is generally referred to as "dicing" and is usually done with a device referred to as a dicing saw, but may be done with other techniques, such as lasers. These cuts may extend only through the transducer and matching material layers, or partly or completely through the circuit layer, or through the circuit layer and at least a part of any backing layers, depending upon the detailed design and implementation of the circuit layers.

The assembly of individual transducer elements with the circuit and matching layers are then bonded to the backing body, which may have a flat, concave or convex face, as described above, with any temporary backing layers being removed as necessary. It should be noted that in certain instances the dicing may be done after the assembly of transducer elements, matching materials, and circuits is bonded to the backing material and that the dicing cuts may extend into the layers of backing material or even into the backing body.

Connections between the thin or thick film circuits connecting to the transducer elements and wires or printed circuits, such as flexible circuits, which in turn connect to the electronics and switching elements may made before or after the transducer assembly is bonded to the backing body, again depending on the detailed design and implementation of these connections.

While methods for the construction of multiple aperture transducer are well known, and similar to those used in construction of single aperture arrays, multiple aperture arrays present greater difficulties than do single aperture arrays. For example, a particular application may require that each element be comprised of three segments, or apertures, that is, two outer segments and a middle segment. This may be achieved, for example, by constructing the transducer elements from three elongated pieces of transducer material, that is, two outer pieces and a middle piece, and then dicing the pieces across the face of the array as was described with regard to single aperture arrays, or by additional cuts along the transducer stack in the longitudinal direction to divide the two outer segments from the middle segment.

A primary problem in constructing transducers, however, is in achieving the electrical connections to the elements and sub-elements, or segments, as the number of elements or sub-element segments increases. That is, the physical dimensions of an array, especially for medical use, is generally constrained, for example, by the need to scan the cardiac structures through the space between patient's ribs to avoid interference by the ribs. At the same time, there is a need and trend to increase the number of elements or sub-elements to achieve every finer scan resolution to achieve increasingly detailed images of the cardiac structures.

While this problem exists even with single aperture transducers, the problem is particularly severe with multiple aperture transducers because the number of electrical connections to each element, each of which may be comprised of three or more segments, or sub-elements, is greatly increased while the space in which to make the connections does not increase. For example, in a single aperture array each element is made of a single segment while in a three aperture array each element is divided into three segments. As a result, while each element of a single aperture array requires a single connection to the single segment that comprises the element, a three aperture array requires, for each element, two separate connections to the two outer segments and a third connection to the middle segment, thereby tripling the number of connections per element, and possibly requiring additional connections to each possible pair of segments. In addition, each middle segment is bounded on both ends by the outer segments of the element and on either side by the two adjacent elements, so that the middle segments are not readily accessible for connections. It is therefore apparent that the space available to make connections to the segments of a multiple aperture array and to run the leads from the segments to the points of connection to the transducer electronics is extremely constrained and that the problem compounds very rapidly as the number of elements in the transducer or the number of segments in each element increases.

Considering a specific example, the Hewlett-Packard Model 21215 transducer provides two sizes of elevation apertures and is constructed generally as described above, that is, of a linear array of separate or separated elements wherein each element is comprised of three separate segments, two outer segments and a middle segment. In this design, the elements are arranged in a straight plane, rather than a concave or convex arc, and the middle segment of each element is connected to a transmit/receive circuit while the two outer segments of the element are connected together and then to a second transmit/receive circuit or through a switch to the same transmit/receive circuit as the middle segment.

Connections to the segments are made through flex circuits, that is, circuits etched onto thin, flexible circuit boards, wherein an individual flex circuit is used for each set of elevation segment connections and wherein each flex circuit contains all of the connections for the corresponding segments of each of the elements along the array. The transducer therefore requires three flex circuits, one for each out row of segments and one for the middle row of segments. The two flex circuits connecting to the outer segments of each element of the outer segments and are then connected by a flex circuit having jumper connections, or by a circuit board. The third flex circuit connects to the middle segments of the elements, and thus must make connection at the middle of the back side of the piezoelectric array.

It is therefore apparent that a three aperture array like the Hewlett-Packard Model 21215 requires three times as many connections to the piezoelectric segments themselves and twice as many flex circuits as in a single aperture array, and two additional flex circuit to flex circuit connections through flex jumper connections or through a printed circuit board for each element. These connections result in higher cost and lower manufacturing yield. In addition, assembly is more complex in that the flex circuit to the middle segments must be carefully aligned with the flex circuits to the outer segments. This factor alone makes it difficult, if not impossible, to manufacture a curved array and the presence of the middle segment flex circuit requires the use of either a poured backing body material or complex molding or machining to manufacture the backing body.

To further compound the problem of achieving a large number of connections and leads to the transducer elements and segments in a small area, the connections to the segments must be made in such a manner as not to interfere with the acoustic characteristics of the transducer. That is, it has been described above that the connections to the transducer elements and segments are generally made through thin or thick film circuits or flex circuits bonded to the back side of the transducer elements. The number of leads and connections, however, generally results in a connection and lead layer or layers having significant thickness and effect, in terms of the acoustic characteristics of the array, thereby distorting or interfering with the acoustic characteristics of the array. In addition, the lead and connection layer or layers and other layers interposed between, such as insulating layers, do not provide smooth surfaces, or planes, because of the raised or depressed areas of the layers forming the leads and connections. As such, it is difficult to reliably bond the layers together without significant additional layers of bonding materials and the unevenness of the surfaces tend to trap bonding material and air between the layers, thereby providing an acoustically non-homogenous "body" bonded to the "back" face of the transducer elements that further interferes with the acoustic characteristics of the transducer array.

The methods used in the prior art to construct multiple aperture arrays include the use of multiple flex circuits, as described just above, connections embedded in the backing body, the use very thin film or deposited circuits to form the connections and leads to the transducer elements and segments, and even the use of electrostrictive rather than piezoelectric materials for the transducer elements.

Each of these methods, however, provides its own difficulties and problems. For example, the disadvantages of multiple flex circuits have been discussed above, and the disadvantages of connections embedded in the backing body are comparable.

An alternative is the use of a multi-layer thick film ceramic hybrid circuit which also serves as the backing body. The laminated layers with embedded connection circuits results in leads which run vertically, that is, perpendicularly, between the segments and an interface circuit to which the connections are made, but also results in leads with very small cross sections that are attached at both ends by butt joints, which lack reliability. The use of a multi-layer thick film circuit, in turn, can provide much stronger and more reliable connections, but the acoustic characteristics of the ceramic material may degrade the acoustic performance of the transducer. Both approaches, moreover, may have the disadvantage of requiring multiple steps to make the connections to the piezoelectric elements and may result in added cost from not using standard printed or hybrid circuit manufacturing techniques.

Yet other approaches use thin film or very thin film circuits for the connections and leads, thereby providing connection and lead layers that are acoustically thin and thereby cause less interference with the acoustic characteristics of the transducer. Thin film circuits, however, are difficult to work with in manufacture, often being relatively fragile, and generally require "wet" manufacturing processes that result in potentially undesirable materials to be disposed of.

In addition, thin film circuits, like thick film circuits and flexible circuits, require connections between layers, for example, between the layer forming contacts to the elements and segments and the layer providing the interconnecting leads, and these interlayer connections, commonly called "vias" are difficult to form in the thicknesses typical of thin film circuits. Certain of the prior art approaches to thin film circuits, for example, while recognizing the advantages of thin film circuits for the actual contacts to the transducer elements and segments and for the interconnecting leads, have required the use of additional, vertically oriented circuit boards or very thin, free standing wires to accomplish the necessary connections.

The present invention provides a solution to these and other problems of the prior art.

SUMMARY OF THE INVENTION

The present invention is directed to a connection assembly for use in a multiple aperture ultrasonic transducer including an array of elements for transmitting or receiving signals that is capable of steering and/or focusing in elevation as well as azimuth and wherein each element is comprised of a plurality of segments and wherein the connection assembly interconnects the segments of each element and connects the segments to transmit/receive circuits to form the apertures of the array, and to a method for constructing such a connection assembly.

According to the present invention, the connection assembly includes an isolating layer and a conductive layer. The isolating layer is superimposed on the segments of the array and has at least one via opening corresponding to and located within the area of each segment of the array. Each via opening exposes a corresponding area of a segment. The conductive layer is superimposed on the isolating layer and has conductive paths interconnecting the segments and connecting the segments to the transmit/receive circuits to form the apertures of the array.

In a presently preferred embodiment, the conductive layer forms a continuous layer covering the isolating layer, the interior surfaces of the via openings and the areas of the segments exposed through the via openings and is scribed to divide the conductive layer into conductive paths interconnecting the segments and connecting the segments to the transmit/receive circuits to form the apertures of the array.

Further according to the present invention, the conductive paths associated with each element are separated from the conductive paths associated with neighboring elements by dicing cuts that divide the portion of the isolating layer and the conductive layer superimposed on the element from the portions of the isolating layer and the conductive layer superimposed on the neighboring elements.

Further according to the present invention, the conductive layer is a deposited conductive layer, and is deposited by a sputtering process.

In a further aspect of the present invention, the connections between the segments and flex leads connecting to the circuitry driving the segments are accomplished at the same time and in the same processes as the connection to and between the segments, rather than in a separate process. According to the present invention, a flex circuit having flex leads is assembled to be coplanar with the segments of the array at the time the isolating and conductive layers are superimposed on the elements of the array, so that the isolating layer and the conductive layer are superimposed upon the flex circuit and scribed in the same steps as the superimposing and scribing of the isolating layer and conductive layer on the elements, with via openings provided through the isolating layer in areas of the flex leads to provide connections between the conductive layer and the flex leads. The conductive layer in the area of the flex leads is then scribed to provide connections between the segments and flex leads formed on the flex circuit, and diced to separate the connections to individual segments in the same step in which the elements are diced into segments.

Other features, objects and advantages of the present invention will be understood by those of ordinary skill in the art after reading the following descriptions of a present implementation of the present invention, and after examining the drawings, wherein:

DETAILED DESCRIPTION

The following will first describe the general construction of multi-aperture transducers, and in particular a typical construction of the circuitry layers bonded to the back, or non-radiating and receiving side, of the transducer elements to provide connections between the transducer element segments and the transmit/receive circuitry associated with the transducer. The present invention will then be described in detail, thereby clearly illustrating the differences between the connection circuitry of the present invention and the connection circuitry generally used in transducers.

A. General Description of a Multi-Aperture Transducer with Multi-Layer Backplane Interconnections (FIGS. 1A, 1B, 2 and 3A–3C and 4)

Figure 1A:
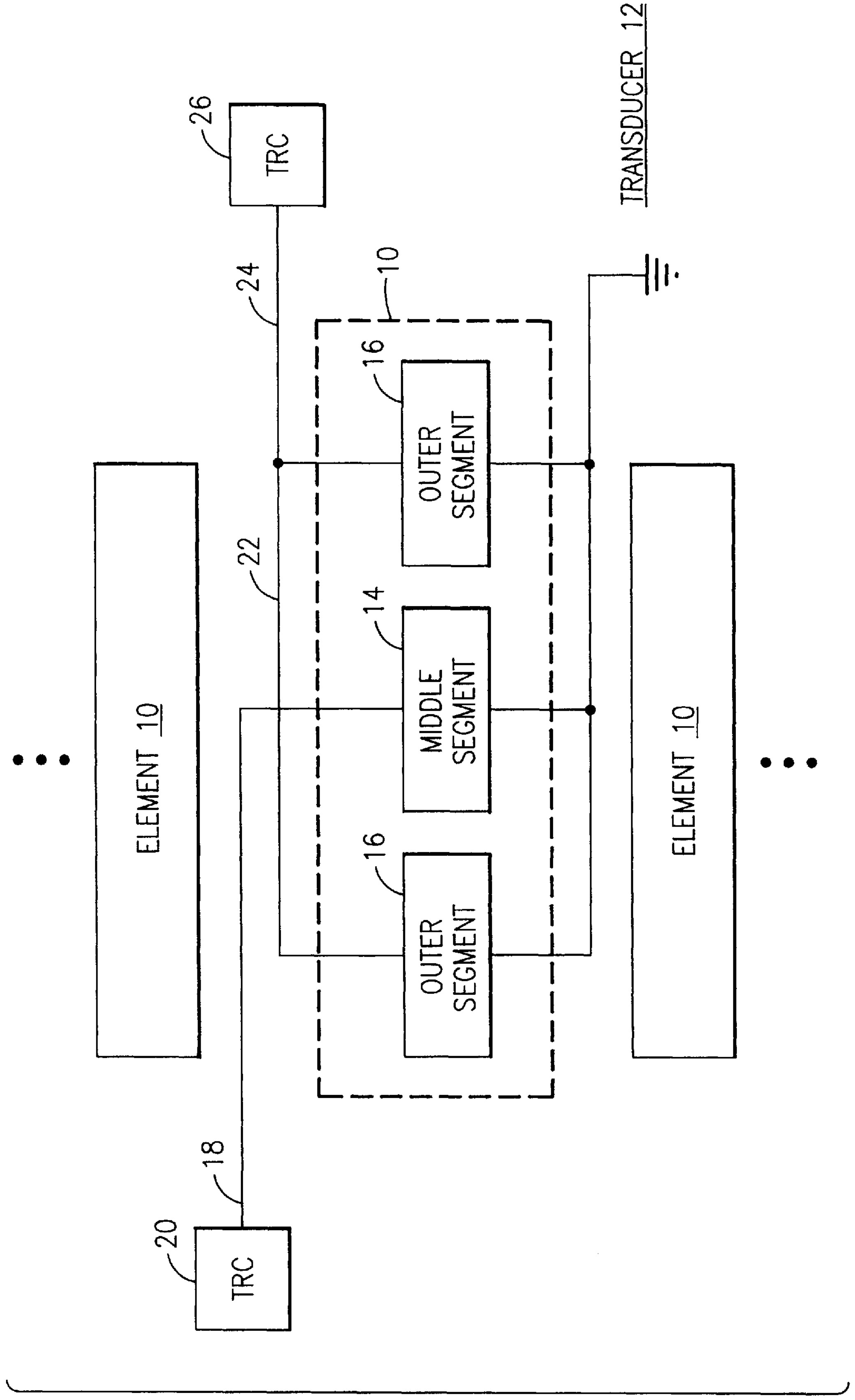
FIG. 1A is an illustration of the segments and connections of a typical two aperture transducer.

Referring to FIG. 1A, therein is shown a diagrammatic representation of a single piezoelectric Element 10 of an exemplary two aperture Transducer 12 and, in outline form, two adjacent Elements 10 of the array of Elements 10 comprising the transmit/receive array of the transducer. As indicated therein, the construction of the transducer as a two aperture transducer requires that each piezoelectric Element 10 be divided into three piezoelectric segments comprised of a single Middle Segment (MS) 14 and two Outer Segments (OSs) 16. As represented, Middle Segment (MS) 14 is connected through a Circuit Lead 18 to a First Transmit/Receive Circuit (TRC) 20 to form the transmit/receive element of a first aperture and Outer Segments (OSs) 16 are interconnected by an Interconnect Lead 22 to form a single unit to together form the transmit/receive element of the second aperture, and are thereafter connected through a Circuit Lead 24 to a Second Transmit/Receive Circuit (TRC) 26. In alternate embodiments, Second Transmit/Receive Circuit (TRC) 26 may be replaced by a switch which selectively connects either Middle Segment (MS) 14 or the two Outer Segments (OSs) 16 to the single First Transmit/Receive Circuit (TRC) 20. It will be noted, as is well understood in the art, that all Elements 10 of the transducer are constructed and interconnected in the same manner as illustrated for the single Element 10 in FIG. 1A and that the Elements 10 will each have a connection to signal and power ground as indicated in FIG. 1A, usually as a common connection shared by all Elements 10.

Figure 1B:
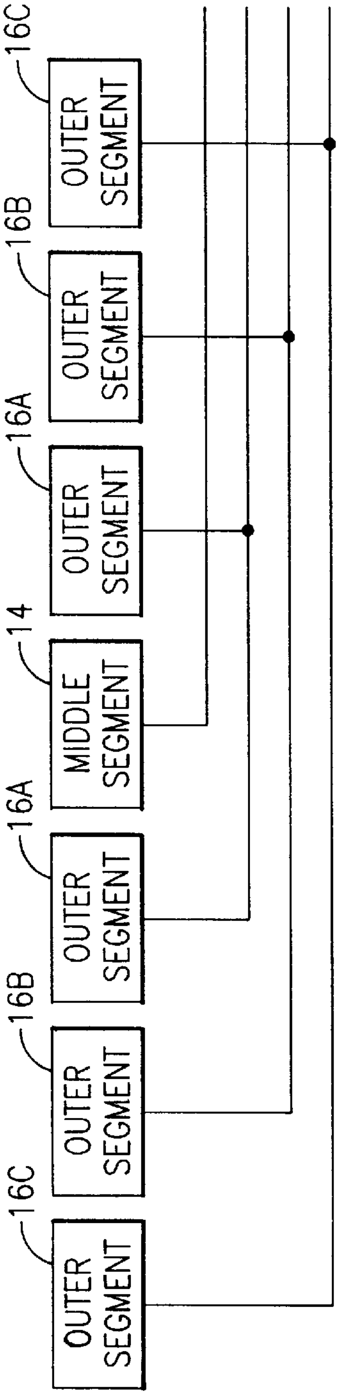
FIG. 1B is an illustration of the segments and connections of a typical four aperture transducer.

It will be recognized by those of ordinary skill in the arts that the element construction and segment connections and interconnections illustrated in FIG. 1A may be extended at will to transducers having larger numbers of apertures. For example, FIG. 1B illustrates a piezoelectric Element 10 of a four aperture transducer. In this transducer, Middle Segment (MS) 14 comprises the transmitting/receiving element for a first aperture, first Outer Segments (OSs) 16A are interconnected to form the transmit/receive element of a second aperture, second Outer Segments (OSs) 16B are interconnected to form the transmit/receive element of a third aperture, and third Outer Segments (OSs) 16C are interconnected to form the transmit/receive element of a fourth aperture. This construction may be expanded indefinitely, adding successive pairs of Outer Segments (OSs) 16 with the Middle Segment (MS) 14 forming one aperture and each successive pair of Outer Segments (OSs) 16 located symmetrically outwards from Middle Segment (MS) 14 forming additional apertures. Again, Middle Segment (MS) 14 and Outer Segments (OSs) 16 will further have a connection to ground.

Figure 2:
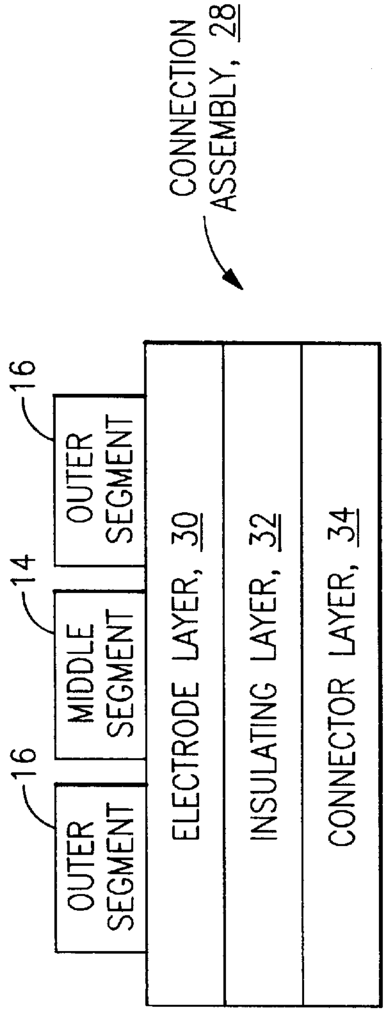
FIG. 2 is a cross sectional representation of a typical two aperture transducer.

As represented in the cross section of Transducer 12 illustrated in FIG. 2, the segment interconnections and connections of the exemplary transducer shown therein are typically formed in a multi-layered Connection Assembly 28 that is comprised of an Electrode Layer 30, an Insulating Layer 32 and a Connector Layer 34 wherein Electrode Layer 30 and Connector Layer 34 may typically be formed of thick or thin film circuits or of flexible circuits. It will be recognized by those of skill in the arts that, although Insulating Layer 32 and Connector Layer 34 are represented in FIG. 2 as single layers for simplicity and clarity of representation and discussion, Insulating Layer 32 and Connector Layer 34 may each or both be comprised of multiple layers and that the layers of Insulating Layer 32 and Connector Layer 34 may be interleaved as necessary to isolate Connection Layers 34 from one another and from Electrode Layer 30.

Electrode Layer 30 is a conductive layer typically comprised of gold with underlying layers of one or more other metals to promote adhesion and defines the electrode areas for the apertures, that is, the connections to the piezoelectric Segments 16 and 14 to form the transmit/receive elements of Transducer 12. Insulating Layer 32, in turn, may typically be comprised of such materials as polymide, silica, and a variety of other oxides, nitrides and polymers and insulates Electrode Layer 30 from Connector Layer 34. Connector Layer 34, in turn, is typically comprised of another layer of conductive metal or metals similar to Electrode Layer 30 and provides the necessary conductive paths between the electrodes of Electrode Layer 30 to selectively interconnect the piezoelectric segments to form the transmit/receive elements of the apertures, such as between two Outer Segments (OSs) 14A, and between the Middle Segment (MS) 12 and Outer Segments (OSs) 14. Connector Layer 34 also provides the conductive paths necessary to connected the piezoelectric segments of each of the apertures to the Flex Circuits **56*b* connecting to the Transmit/Receive Circuit (TRC)s 20, 26. Connection Assembly 28 typically has a total acoustic thickness of approximately 5 to 10 microns, and thereby does not adversely affect the acoustic characteristics of the transducer assembly. As will be described further below, the electrode areas of Electrode Layer 30 are selectively connected to the connection paths of Connector Layer 34 through conductive paths, referred to as "vias" running between Electrode Layer 30 and Connector Layer 34 through Insulating Layer 32**.

Lastly, it will be noted that, as described above, Middle Segment (MS) 14 and Outer Segments (OSs) 16 will have connections to ground, often implemented as a common connection that is shared by all Segments 14,16 and that is connected to the faces of Segments 14,16 opposite the faces connecting to Electrode Layer 30. A common method for implementing this ground connection is through a ground plane that may be implemented, for example, as a layer on the faces of Segments 14,16 opposite Connection Assembly 28 with the ground layer extending to the edges of Elements 10 for connection to ground. It will be noted that these ground connections are not explicitly illustrated or shown in the following descriptions or the figures referred to therein, for purposes of clarity of presentation and discussion, but are present and, as well understood by those of ordinary skill in the relevant arts, may be implemented using the methods just discussed and other analogous methods.

Figure 3A:
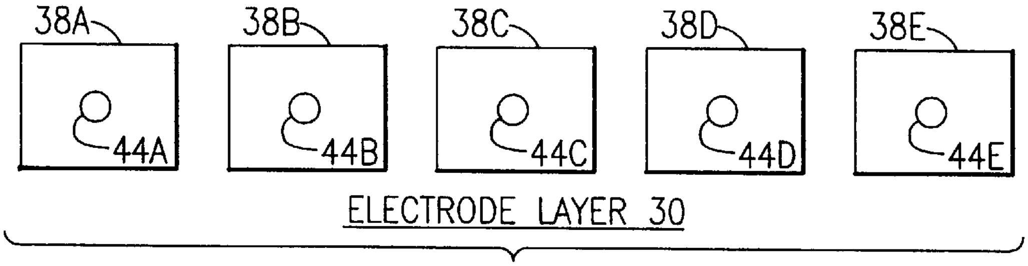
FIGS. 3A, 3B and 3C are representations of the electrode layer, insulating layer and connector layer or a typical three aperture transducer.
Figure 3B:
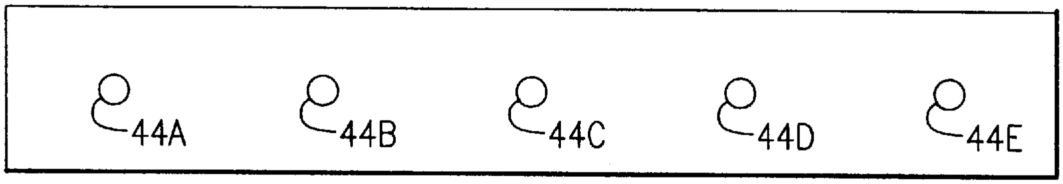
Figure 3C:
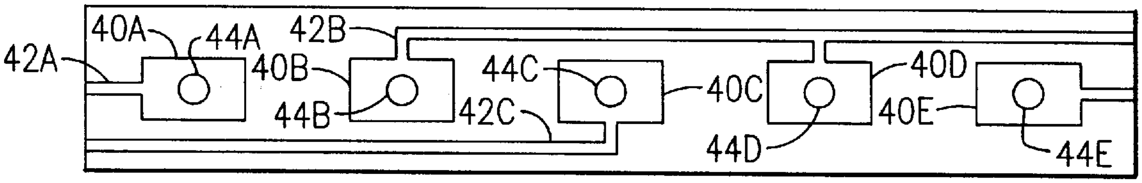

The construction of a Connection Assembly 28 with the three layers thereof is further illustrated in FIGS. 3A through 3C with the Electrode Layer 30, Insulating Layer 32 and Connector Layer 34 of the Connection Assembly 28 viewed from the "bottom" or "back" side, that is, as viewed from the side of the piezoelectric transducer elements to which the Connection Assembly 28 is bonded. FIGS. 3A through 3C illustrate a three aperture Transducer 12 having five segments, the exemplary transducer shown in FIGS., 3A through 3C having been expanded from the two aperture transducer of FIG. 2 to more thoroughly illustrate the connections and conductive paths of Electrode Layer 30, Insulating Layer 32 and Connector Layer. It will be understood that the components of Construction Assembly 28 as illustrated in FIGS. 3A through 3C and in the following text illustrate the structure and construction of each component thereof in the area of and under a single Element 10 of the exemplary three aperture Transducer 12 and that this structure and construction will be repeated as a single continuous structure extending under each Element 10 of the Transducer 12 and for the entire length of the array comprised of the Elements 10.

The segments of the three aperture Transducer 12 shown in FIGS. 3A through 3C are designated as Segments 36A through 36E wherein Segments 36A and 36E correspond generally to Outer Segments 16 of FIG. 1A and Segment 36C corresponds generally to Middle Segment 14 while Segments 36B and 36D are located between Outer Segments 16 and Middle Segment 14 and to either side of Middle Segment 14. It will be understood that a first aperture is formed by Segment 36C, a second aperture by Segments 36B and D and the third aperture by Segments 36A and 16E. It will also thereby be understood that the second aperture is formed by connecting together Segments 36B and 36D into a first electrical unit and the third aperture by connecting together Segments 36A and 36E into a second electrical unit.

FIG. 3A illustrates the Electrode Layer 30 of the Connection Assembly 28 and it is shown therein that Electrode Layer 30 includes conductive electrode area under and corresponding to each of Segments 36A through 36E. These electrode areas are respectively designated as Electrode Areas 38A through 38E and each electrically connect or bond to the corresponding ones of Segments 36A through 36E, thereby establishing separate electrical connections to the segments of the Element 10. Insulating Layer 32, in turn, is shown in FIG. 3B and it will be seen therein that Insulating Layer 32 generally covers Electrode Areas 38A through 38E, thereby insulating Electrode Areas 38A through 38E from the conductive paths of Connector Layer 34.

As shown in FIG. 3C, Connector Layer 34, in turn, is comprised of conductive Via Areas 40A through 40E, each of which corresponds to one of Electrode Areas 38A through 38E, a first Aperture Path 42A running from Via Area 40A, and thus from Segment 36A, to the edge of Element 10, a second Aperture Path 42B connecting to Via Areas 40B and 40D, and thus to Segments 36B and 36D, and running to the edge of Element 10, and a third Aperture Path 42C is connected to Via Area 40C and thus to Segments 36C and runs to the edge of Element 10. Finally, a fourth Aperture Path 42D is connecting to Via Area 40E and thus to Segment 36E and runs to the edge of Element 10, with Aperture Paths 42A and 42D being connected together through the flex wiring external to the transducer to form the aperture comprised of Segments 36A and 38E.

Finally, each of Electrode Areas 38A through 38E is connected to the corresponding one of Via Areas 40A through 40E, thereby interconnecting Segments 36 into the three apertures and to the flex leads to the transmit/receive electronics, by corresponding Vias 44A through 44E wherein each Via 44 is a conductive path running between Electrode Layer 30 and Connector Layer 34.

Figure 4:
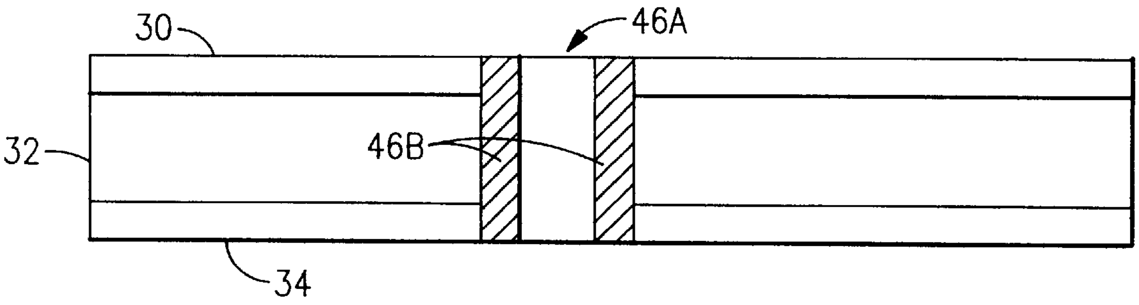
FIG. 4 is a cross sectional illustration of a typical via.

As is well known in the art, and as is generically illustrated in FIG. 4, a Via 44 formed in a three layer connection assembly that includes an Electrode Layer 30, an Insulating Layer 32 and a Connector Layer 34 is generally constructed by drilling an opening or Hole 46A between the two conductive layers of the Connection Assembly 28, that is, between the Electrode Layer 30 and the Connector Layer 34, wherein the Hole 46A forms a conductive path between the two conductive layers by means of a layer of Conductive Material 46B deposited on the inner surface of the Hole 46A by any of a variety of commonly employed techniques.

It will be appreciated by those of ordinary skill in the relevant arts that the reliable manufacture of three layer Connection Assemblies 28 comprised of an Electrode Layer 30, an Insulating Layer 32 and a Connector Layer 34 with such vias can be difficult. It will also be apparent to those of ordinary skill in the relevant arts that the reliable manufacture of connection assemblies with vias is significantly easier using the methods of the present invention as described below.

B. Detailed Description of a Preferred Embodiment (FIGS. 5, 6 and 7)

Having described the general construction of a typical Connection Assembly 28, the following will now describe a Connection Assembly 28 according to the present invention.

Figure 5A:
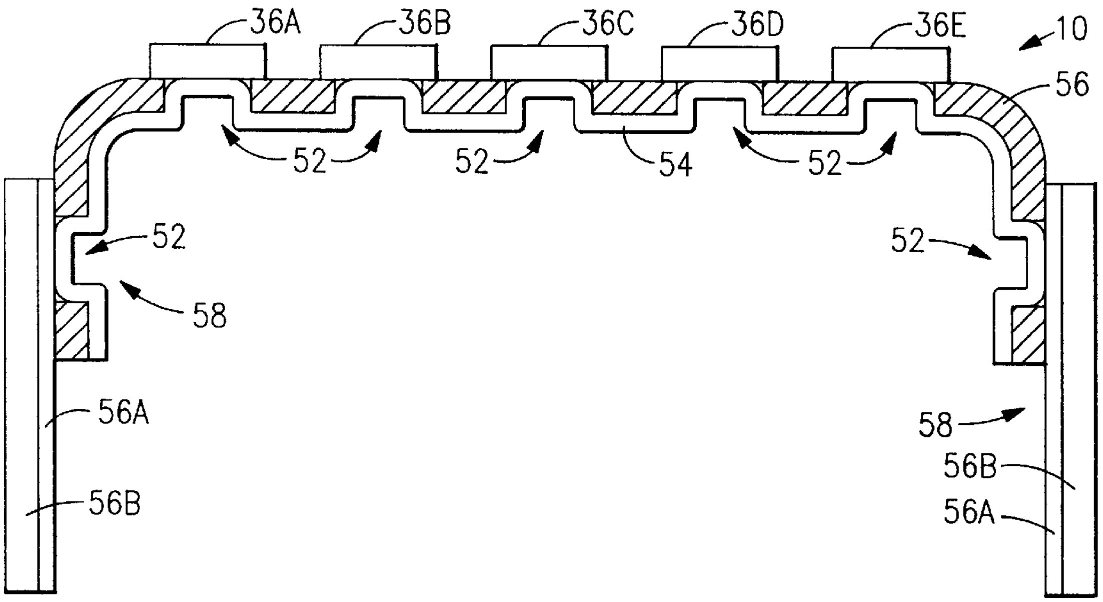
FIG. 5A is a cross sectional illustration of a connection assembly of the present invention.
Figure 6:
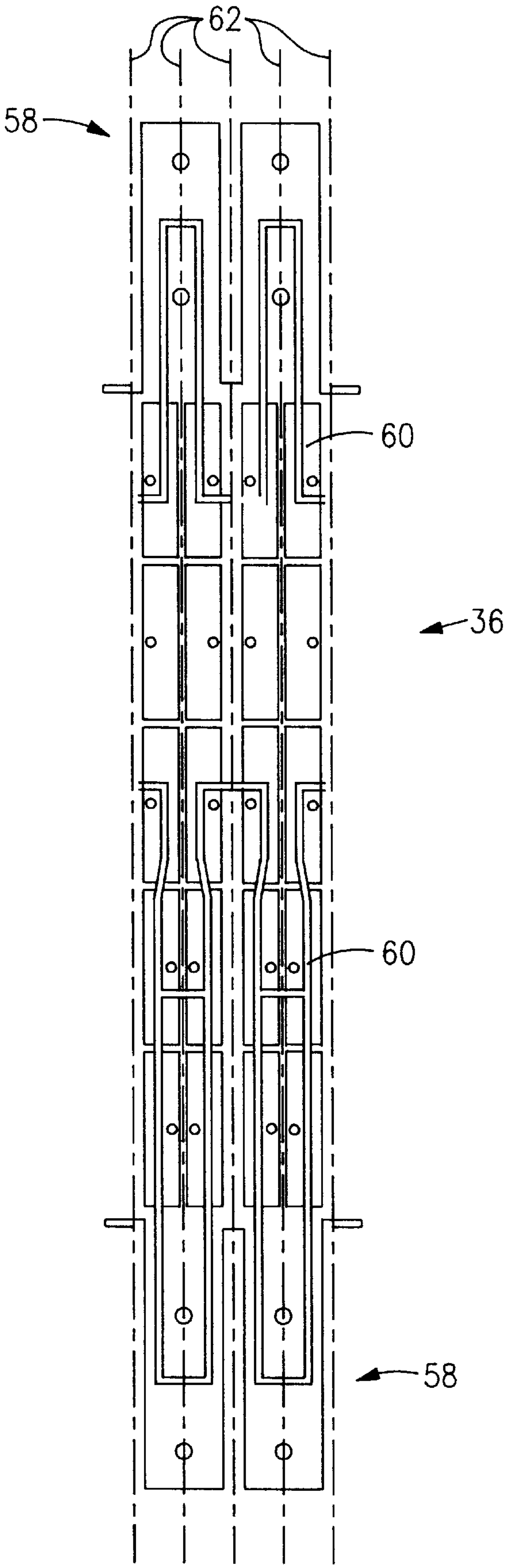
FIG. 6 is a diagrammatic view of a connection assembly of the present invention with scribing lines and dicing lines and conductor paths; and, FIGS. 7A, 7B, 7C and 7D are diagrammatic representations of the elements, isolating layer, scribed conductive layer and assembled connection assembly of the present invention.

Referring to FIG. 5A, therein is illustrated a side sectional view of a Connection Assembly 48 of the present invention. As illustrated therein, and according to the present invention, all three layers of the Connection Assembly 28 described above, that is, Electrode Layer 30, Insulating Layer 32 and Connector Layer 34, are replaced with a single Isolating Layer 50 and a single Conductive Layer 54 wherein Isolating Layer 50 is provided with Via Openings 52 therethrough in locations corresponding, for example, to the Vias 44 illustrated in FIGS. 3A through 3C. Conductive Layer 54 is deposited on the lower surface of Isolating Layer 50, that is, on the side of Isolating Layer 50 opposite Segments 36 of the Elements 10, and completely covers the lower surface of Isolating Layer 50, the inner surfaces of Via Openings 54 and the portions of the lower surfaces of Segments 36 of Elements 10 that are exposed through Via Openings 54.

It may therefore be seen that the single Conductive Layer 54 thereby provides both the conductive paths formerly provided by Connector Layer 34 and the connections between the conductive paths and the Elements 10 formerly provided by the Vias 44 of the three layer Connection Assembly 28 illustrated in FIGS. 1 through 4, while the material of Elements 10 itself provided the connections formerly provided by Electrode Layer 30. It may also be seen that the single Isolating Layer 50 performs all of the functions previously performed by Insulating Layer 32 of the three layer Connection Assembly 28 illustrated in FIGS. 1 through 4.

As will be described further below, the area of Conductive Layer 54 on the lower surface of Isolating Layer 50 is then scribed, for example, by a scribing laser, to separate areas of the area of Conductive Layer 54 on the lower surface of Isolating Layer 50 into conductive paths interconnecting the Segments 36 into apertures.

In addition to replacing the Electrode Layer 30, Insulating Layer 32 and Connector Layer 34 of the Connection Assembly 28 discussed above, the single Isolating Layer 50 and Conductive Layer 54 also provides the connections between the apertures, that is, Segments 36, and Flex Leads 56 that were previously made through extensions to the Connector Layer 34, referred to as "tab areas", which were used to provide areas outside of the segments wherein the Flex Leads 56 could be connected to the Connector Layer 34 in the three layer Connection Assembly 28 comprised of an Electrode Layer 30, Insulating Layer 50 and Conductive Layer 54.

Figure 5B:
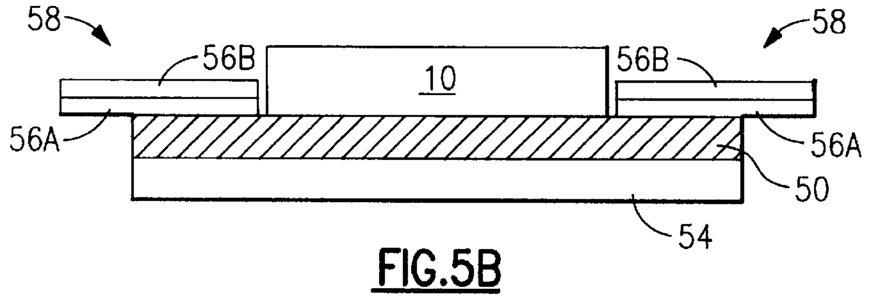
FIG. 5B is a diagrammatic cross section view of the connection assembly of the present invention illustrating the manufacture of the connection of flex leads to the segments of a transducer.

According to the present invention, and as illustrated in FIG. 5B, Flex Leads 56*a* are assembled so that the surface of the Flex Circuit 56*b* having Flex Leads 56*a* is coplanar with the lower surface of Elements 10. Isolating Layer 50 and Conductive Layer 54 are then deposited upon the Flex Circuit 56*b* having Flex Leads 56*a* in the same process in which Isolating Layer 50 and Conductive Layer 54 are deposited on Elements 10 and as continuous layers with the areas of Isolating Layer 50 and Conductive Layer 54 residing on Elements 10. The areas of Isolating Layer 50 and Conductive Layer 54 deposited on the Flex Circuit 56*b*, identified as Flex Connect Areas 58, include Via Openings 52, in the manner described above, for connecting Conductive Layer 54 to Flex Leads 56*a*. The Flex Connect Areas 58 of Conductive Layer 54 are scribed in the same process in which the portion of Conductive Layer 54 on the lower surface of Elements 10 is scribed to form the conductive leads between Segments 36 and Flex Leads 56*a*. As described further below, the Flex Circuits 56*b* having Flex Leads 56*a* and the associated areas of Isolating Layer 50 and Conductive Layer 54, including Flex Connect Areas 58, are subsequently diced in the same process in which Elements 10 are diced into Segments 36. Then, and as illustrated in FIG. 5C, the Flex Circuits 56*b* having Flex Leads 56*a* are bent "downwards" to connect to the circuitry driving Segments 36. As a consequence, the connections between Segments 36 and Flex Leads 56*a* are accomplished at the same time and in the same processes as the connections to and between Segments 36, thereby further reducing the complexity and costs of manufacturing the transducer.

According to the present invention, therefore, Isolating Layer 50 performs the general functions performed by Insulating Layer 32 as illustrated in FIGS. 2 and 3A through 3C, but Conductive Layer 54 now performs all of the functions previously performed by Electrode Areas 38, Vias 44, Via Areas 40, Aperture Paths 42 and Tab Areas 58. In particular, it will be noted that the "bottoms" of Via Openings 52 are, in fact, areas of the lower surfaces of the Segments 36 of the Elements 10 so that the areas of Conductive Layer 54 that are plated or deposited thereupon make electrical contact and connection with Segments 36 and serve the function previously served by Electrode Areas 38. Conductive Layer 54 further extends from the "bottoms" of Via Openings 52 and "up" the inner surfaces of Via Openings 52 to continue on the lower surface of Isolating Layer 50, thereby serving the function previously served by Vias 44. Finally, and as described, the conductive paths cut or etched into the area of Conductive Layer 54 on the lower surface of Isolating Layer 50 serve the functions previously served by Via Areas 40 and Aperture Paths 42.

Referring now to FIG. 6, therein is illustrated a bottom view of a section of an Isolating Layer 50 with Conductive Layer 54, that is, a view from the side having Conductive Layer 50, for a three aperture transducer and showing four Elements 10 wherein each Element 10 is comprised of five Segments 36. The view presented therein is represented as if Isolating Layer 50 and Conductive Layer 54 were transparent, so as to clearly illustrated the relationships between the elements to be described in the following. It will be understood, however, that Isolating Layer 50 and Conductive Layer 54 are to be understood to be present in FIG. 6.

Assembly of the transducer begins with the bonding of Isolating Layer 50 to the lower surface of the block or blocks of piezoelectric material that will form Elements 10 and Segments 36. It will be understood that, at this time, there may be a separate block of piezoelectric material for each row of Segments 36, or that a single block of piezoelectric material may be cut longitudinally into separate blocks corresponding to the rows of Segments 36.

At this point in the process, Isolating layer 50 will be a single, smooth, continuous sheet of dielectric or insulating material, such as polymide, having a thickness in the range of range of 0.5 microns to 20 microns and having a width and length corresponding to the length and width of the Elements 10 of the transducer with the areas for establishing connections to Flex Leads 56*a*. In the present example, the transducer has 128 Elements 10, each being comprised of 5 segments, and a total length and width of 12 mm (millimeter) by 0.17 mm; each Segment 36 is approximately 2.4 mm by 0.17 mm and each Element 10 is separated from the adjacent Elements 10 by 0.035 mm while the Segments 36 in each Element 10 are separated by approximately 0.035 mm and the areas for connection to Flex Leads 56*a* are approximately 0.050 mm wide.

An opening will then be drilled through Isolating Layer 50, for example, by use of a laser, at the location of each Via Opening 52, thereby forming Via Openings 52, wherein Via Openings 52 may have a diameter in the range of 25 microns, approximately 0.001 inch, with the piezoelectric material of the Segments 36 exposed in the bottoms of the Via Openings 52 serving in replacement of Electrode Areas 38 of the three layer Connection Assembly 28 illustrated in FIGS. 1 through 4.

Conductive Layer 54 will then be deposited onto Isolating Layer 50, and into Via Openings 53, preferably by a sputtering technique. Conductive layer 54 may, for example, be comprised of gold, will have a thickness in the range of 100 Angstroms to 20,000 Angstroms, and will generally cover the entire surface of Isolating Layer 50, including the interior surfaces and bottoms of Via Openings 52 It will be appreciated from the above description of the present invention that, at this time and before scribing, Conducive Layer 54 will present an smooth, flat, continuous plane of conductive material bonded to Isolating Layer 50, the only surface feature being possible slight depressions at Via Openings 52.

The material of Conductive Layer 54 is then scribed or cut away, again for example using a laser scribing tool, along Scribing Lines 60 as illustrated in FIG. 6 to divide Conductive Layer 54 within the area of each Element 10, that is, within the area of the Segments 36 of each Element 10, into conductive paths interconnecting the Segments 36 of each Element 10 and connecting the Segments 36 to Flex Leads 56*a*. In the present implementation of the invention, the width of Scribing Lines 60 is in the range of 12 microns, that is, 0.0005 inch.

The piezoelectric material, Isolating Layer 50 and Conductive Layer 54 are then sliced, or "diced", along the Dicing Line 62 between each column of Segments 36 forming an Element 10, that is, between Elements 10, to divide the piezoelectric material into Elements 10 and, at the same time, separating the conductive paths formed in Conductive Layer 54 for the Segments 36 of each Element 10 from the conductive paths formed for the Segments 36 of the adjacent Elements 10. It will be noted that Scribing Lines 60 and Via Openings 52 are set inwards from the edges of Segments 36, that is, from Dicing Lines 62, by approximately 35 microns, that is, 0.0014 inch, in the present implementation, to avoid interference between Scribing Lines 60 and Via Openings 52 and the dicing cuts.

A study of FIG. 6 will show that the conductive paths formed by scribed and diced Conductive Layer 54 at this point forms the connections described above to construct a three aperture transducer array wherein each Element 10 is comprised of five Segments 36. That is, and as described previously, in each Element 10 a first aperture is formed by Segment 36C, which has a Conductive Layer 54 path to a connection to a Flex Lead 56*a,* a second aperture is formed by Segments 36B and 36D, which are connected together and to a Flex Lead 56*a* by another Conductive Layer 54 path, and the third aperture is formed by Segments 36A and 16E, which are connected together and to a Flex Lead 56*a* by another Conductive Layer 54 path.

Figure 7D:
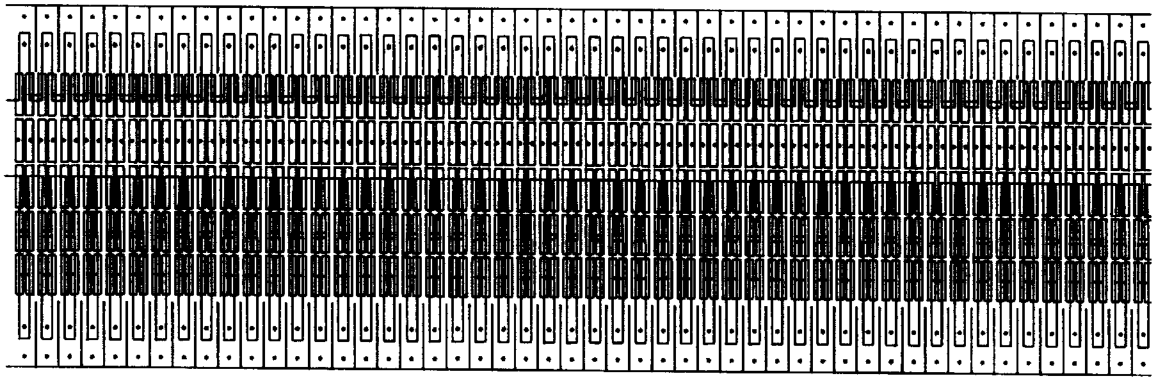
Figure 7A:
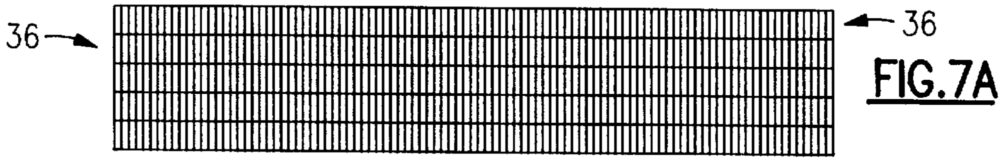
Figure 7B:
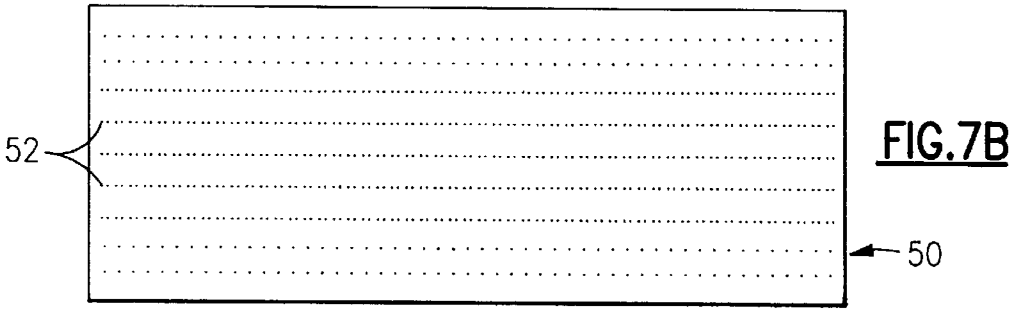
Figure 7C:
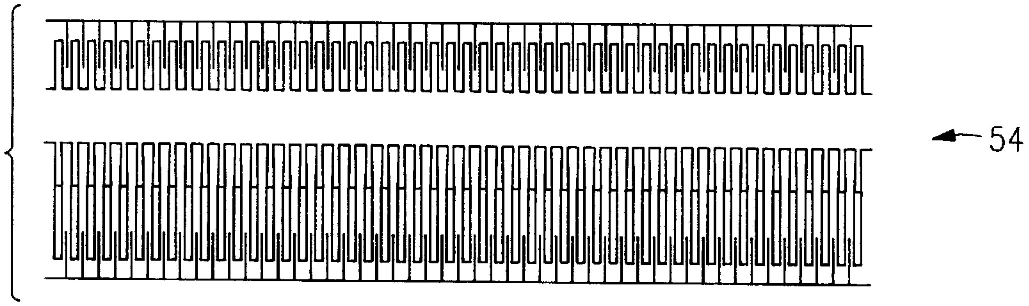

Referring finally to FIGS. 7A, 7A, 7C and 7D, therein is represented the Segments 36 with Isolating Layer 50 and Conductive Layer 54 after cutting of Scribing Lines 60 and Dicing Lines 62 for an 128 element, 3 aperture transducer. FIG. 7A shows the array of Elements 10 comprised of Segments 36 while FIG. 7B shows Isolating Layer 50 with Via Openings 52 and FIG. 7C shows Conductive Layer 54 with Scribing Lines 60. Finally, FIG. 7D shows the complete assembly of Segments 36, Isolating Layer 50 and Conductive Layer 54 after Conductive Layer 54 has been scribed and the assembly has been diced.

It therefore apparent from the above that Isolating Layer 50 and the scribed Conductive Layer 54 together comprise an acoustically thin layer forming an essentially flat surface having few or no acoustically significant voids or discontinuities. As a result, the Connection Assembly 48 comprised of Isolating Layer 50 and the scribed Conductive Layer 54 does not interfere with or degrade the acoustic characteristics of the transducer. In addition, it is apparent that a Connection Assembly 48 comprised of an Isolating Layer 50 and a scribed Conductive Layer 54 may be constructed through significantly simpler processes than the multiple layer connection assemblies of the prior art, and at significantly decreased manufacturing costs. In addition, a transducer utilizing the Connection Assembly 48 of the present invention may be manufactured entirely with "dry" processes, thereby eliminating or avoiding the use of "wet" processes and potentially hazardous materials.

Lastly, while the invention has been particularly shown and described with reference to preferred embodiments of the apparatus and methods thereof, it will be also understood by those of ordinary skill in the art that various changes, variations and modifications in form, details and implementation may be made therein, as has been discussed herein above, without departing from the spirit and scope of the invention as defined by the appended claims. For example, the number, proportions, dimensions, arrangement and spacing of segments and elements in a transducer may vary widely, as may the number and arrangement of the apertures of the transducer, and the segments and elements need not be of uniform dimensions. Likewise, the materials and dimensions of the isolating and conductive layers and the vias and paths scribed into the conductive layer may vary, and there may be multiple isolating and conductive layers, depending, for example, on the connections to be made to and between the segments. Further, the conductive paths of each element may be separated from the conductive paths of the other elements by scribing, instead of by the dicing cut. In addition, the isolating layer as well as the conductive layer may be deposited, and formed from materials suitable to the functions of the layers, such as polymide, polyester, copper, gold, graphite, and so on, or the isolating layer or the conductive layer, or both, may be plated layers using "wet" processes, if necessary or, in certain circumstances, desirable. Further, electrostrictive materials may be used in place of piezoelectric materials, with corresponding changes in the connections provided through the vias and conductive layer. Therefore, it is the object of the appended claims to cover all such variation and modifications of the invention as come within the true spirit and scope of the invention.

What is claimed is:

1. A multiple aperture ultrasonic transducer including an array of elements for transmitting or receiving signals, wherein each element is comprised of a plurality of segments, and a connection assembly for interconnecting the segments of each element and for connecting the segments to transmit/receive circuits to form the apertures of the array the connection assembly comprising:

an isolating layer superimposed on the segments of the array, the isolating layer having at least one via opening corresponding to and located within the area of each segment of the array, each via opening exposing a corresponding area of the corresponding segment, and a conductive layer superimposed on the isolating layer and having conductive paths interconnecting the segments and connecting the segments to the transmit/receive circuits to form the apertures of the array, wherein the conductive layer is superimposed on and continuously covers the isolating layer, the interior surfaces of the via openings and the areas of the segments exposed through the via openings, and is scribed to divide the conductive layer into the conductive paths interconnecting the segments and connecting the segments to the transmit/receive circuits to form the apertures of the array.

2. The connection assembly of claim 1 wherein the conductive layer is a deposited conductive layer.

3. The connection assembly of claim 2 wherein the conductive layer is deposited by a sputtering process.

4. A multiple aperture ultrasonic transducer including an array of elements for transmitting or receiving signals, wherein each element is comprised of a plurality of segments, and a connection assembly for interconnecting the segments of each element and for connecting the segments to transmit/receive circuits to form the apertures of the array, the connection assembly comprising:

an isolating layer superimposed on the segments of the array, the isolating layer having at least one via opening corresponding to and located within the area of each segment of the array each via opening exposing a corresponding area of the corresponding segment, and a conductive layer superimposed on the isolating layer and having conductive paths interconnecting the segments and connecting the segments to the transmit/receive circuits to form the apertures of the array, wherein the conductive paths associated with the segments of each element are separated from the conductive paths associated with the segments of each adjacent element by a dicing cut that separates the portion of the isolating layer and the conductive layer superimposed on the segments of each element from the portion of the isolating layer and the conductive layer superimposed on the segments of each adjacent element.

5. A multiple aperture ultrasonic transducer including an array of elements for transmitting or receiving signals, wherein each element is comprised of a plurality of segments, and a connection assembly for interconnecting the segments of each element and for connecting the segments to transmit/receive circuits to form the apertures of the array, the connection assembly comprising:

an isolating layer superimposed on the segments of the array, the isolating layer having at least one via opening corresponding to and located within the area of each segment of the array, each via opening exposing a corresponding area of the corresponding segment, and a conductive layer superimposed on the isolating layer and having conductive paths interconnecting the segments and connecting the segments to the transmit/receive circuits to form the apertures of the array, wherein the isolating layer and the conductive layer are superimposed upon a flex circuit coplanar with the segments and with via openings through the isolating layer in the area of the flex circuit and wherein the conductive layer is scribed to provide connections between the segments and flex leads formed on the flex circuit.

* * * * *